US012787191B2

(12) United States Patent
Chen

(10) Patent No.: US 12,787,191 B2
(45) Date of Patent: Nov. 3, 2026

(54) CASE FOR ELECTRONIC DEVICE COMBINED WITH DECORATIVE COMPONENT MADE OF DIFFERENT MATERIAL

(71) Applicant: TELON TECHNOLOGY CO., LTD., Taipei (TW)

(72) Inventor: En-You Chen, Taipei (TW)

(73) Assignee: TELON TECHNOLOGY CO., LTD., Taipei City (TW)

( * ) Notice: Subject to any disclaimer, the term of this patent is extended or adjusted under 35 U.S.C. 154(b) by 93 days.

(21) Appl. No.: 18/959,394

(22) Filed: Nov. 25, 2024

(65) Prior Publication Data

US 2026/0122810 A1 Apr. 30, 2026

(30) Foreign Application Priority Data

Oct. 29, 2024 (TW) ................................ 113211745

(51) Int. Cl.
*H05K 5/02* (2006.01)

(52) U.S. Cl.
CPC ........... *H05K 5/0243* (2013.01); *H05K 5/023* (2013.01)

(58) Field of Classification Search
CPC .................................................... H05K 5/0243
See application file for complete search history.

(56) References Cited

U.S. PATENT DOCUMENTS

| | | | | |
|---|---|---|---|---|
| 2020/0371567 | A1* | 11/2020 | Chuang | G06F 1/184 |
| 2023/0280786 | A1* | 9/2023 | Harvey | B29C 64/118 |

FOREIGN PATENT DOCUMENTS

| | | |
|---|---|---|
| CN | 104571323 | 4/2015 |
| CN | 108762426 | 11/2018 |
| CN | 220691344 | 3/2024 |

* cited by examiner

*Primary Examiner* — Jerry Wu
(74) *Attorney, Agent, or Firm* — MUNCY, GEISSLER, OLDS & LOWE, P.C.

(57) ABSTRACT

A case for an electronic device combined with a decorative component made of a different material is provided. The case includes a case body and at least one of the decorative component. The decorative component includes a carrier assembled to the case body and a decorative element disposed on the carrier, wherein the carrier includes a decorative surface opposite to the case body, and the decorative element is provided on the decorative surface, the decorative element being made of a material different from the case body, such as leather, wood grain, etc., so that the case provides a different visual effect than conventional cases.

6 Claims, 20 Drawing Sheets

CASE FOR ELECTRONIC DEVICE COMBINED WITH DECORATIVE COMPONENT MADE OF DIFFERENT MATERIAL

FIELD OF THE INVENTION

The present invention relates to a case for an electronic device, and more particularly, to a case combined with a decorative component made of a different material.

BACKGROUND OF THE INVENTION

With advances in technology, the visual perception that can be provided by cases is no longer what it was before. In terms of computer mainframe cases, the earlier cases can only be decorated with heat dissipation holes, while the current cases can be decorated with transparent panels in addition to the aforementioned heat dissipation holes. Existing cases are provided with internal perspective functions by means of heat dissipation holes, transparent panels, etc., so that a user can directly observe the interior of the case. Furthermore, if the case is used with electronic components (such as light-emitting parts, light-emitting fans, holographic fans, etc.) which can generate visual effects, the user can also own the superposition of light effects, so that the interior of the case has richer visual aesthetics.

However, the case with the above-mentioned mesh panel and transparent panel as the side panels are generally limited in structural strength, which limits the manner of decoration. For example, the mesh panel and the transparent panel are not easily combined with a decorative component made of a different material due to insufficient structural strength. In addition, the conventional case which is covered by a decorative component of the case made of a different material shields the mesh panel, thereby affecting the heat dissipation of the case.

In addition, currently marketed products and patent documents CN 220691344U, CN 104571323A, CN 108762426A, etc. have disclosed that a handle is disposed on the case. It should be noted that either commercial products or patent documents will fix the handle directly to the case, which will achieve the purpose of handle setting, but will weaken the strength of the case.

SUMMARY OF THE INVENTION

The main object of the present invention is to solve the problem that a conventional case is not easily combined with a decorative component made of a different material.

Another object of the present invention is to solve the problem that the conventional handle is directly fixed to the case, which is liable to weaken the strength of the case.

In order to achieve the above object, the present invention provides a case combined with a decorative component made of a different material is provided, including a case body and at least one of the decorative component. The decorative component includes a carrier assembled to the case body and a decorative element disposed on the carrier, wherein the carrier includes a decorative surface opposite to the case body, and the decorative element is provided on the decorative surface, the decorative element being made of a material different from the case body.

In an example, the case body is divided into a transparent region and a non-transparent region by the decorative component at a side of the case body provided with the decorative component.

In an example, the case body is provided with a transparent glass at a side of the case body provided with the decorative component.

In an example, the case body is formed with a plurality of through holes at a side of the case body provided with the decorative component.

In an example, the case comprises a plurality of decorative components.

In an example, the plurality of decorative components are located on opposite sides of the case body, and the case is provided with a handle with two ends located on opposite sides of the case body by taking the plurality of decorative as a connection basis.

In an example, the handle is provided with a plurality of pivots connecting the plurality of decorative components, the handle is allowed to pivot relative to the plurality of decorative components.

In an example, the decorative component is provided with a first positioning structure disposed on the carrier, and the case body is provided with a second positioning structure cooperating with the first positioning structure.

In an example, the case body is provided with at least one engaging part, and the decorative component is provided with at least one guiding grab disposed on the carrier and penetrating into the at least one engaging part.

In an example, the case body includes a plurality of side panels, and one of the plurality of side panels assembled with the decorative component comprises at least one mounting sub-panel, and the at least one mounting sub-panel is assembled with at least one of the other side panels which is adjacent to the side panel assembled with the decorative component.

According to the foregoing embodiment of the present invention, the following features are provided in comparison with the conventional method. The at least one decorative component according to the present invention is provided with the carrier, wherein the carrier is provided with the decorative material of a different material provided on the decorative surface, so that the decorative material can be assembled on the case body. Thus, the decorative material and the case body together can present a visual effect, and the user can obtain a visual perception different from the past.

DETAILED DESCRIPTION OF THE PREFERRED EMBODIMENTS

The detailed description and technical contents of the present invention are now described with reference to the drawings as follows.

Figure 1:
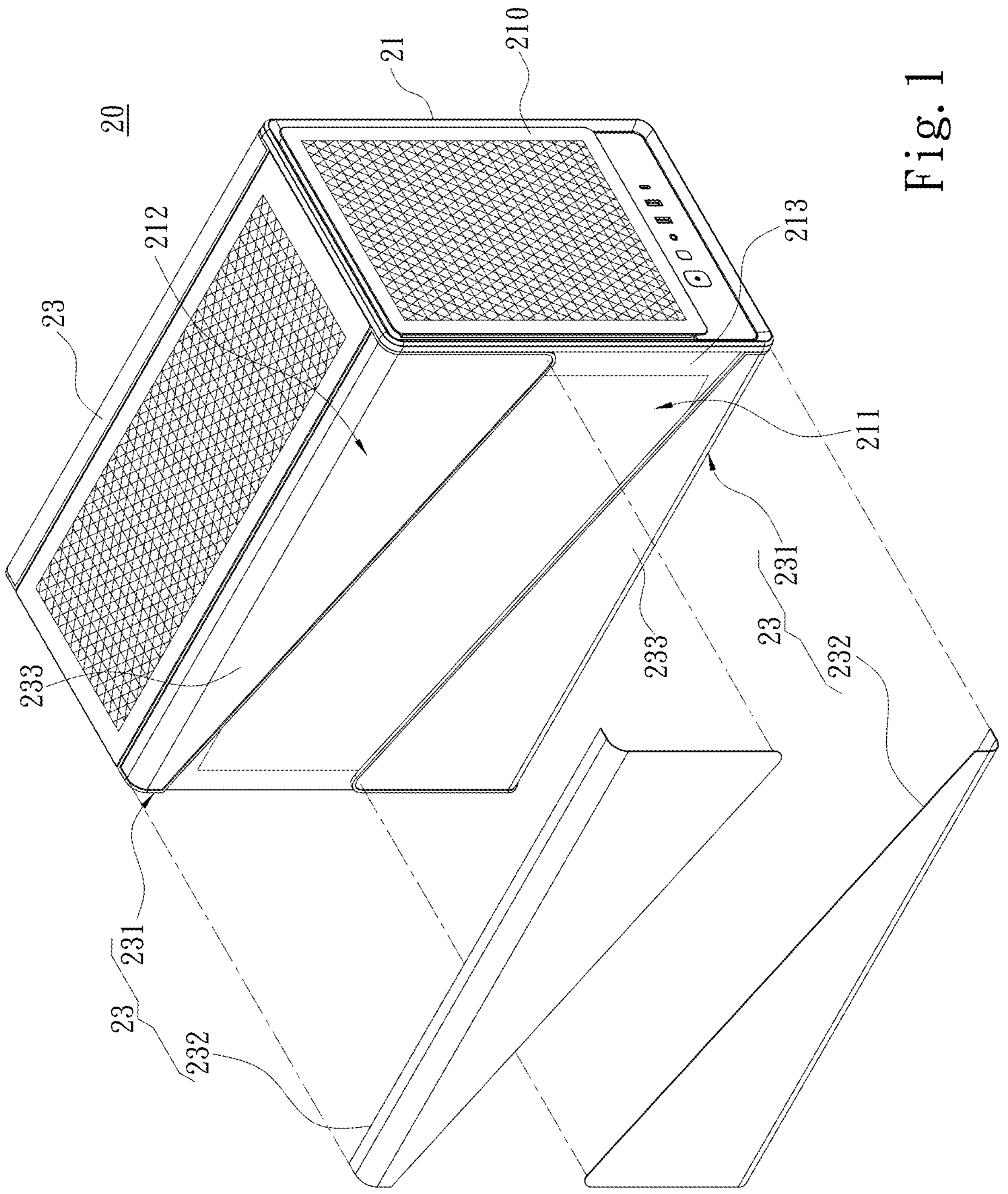
FIG. 1 shows an exploded view (I) of a first example of the present invention implemented in transparent glass.
Figure 2:
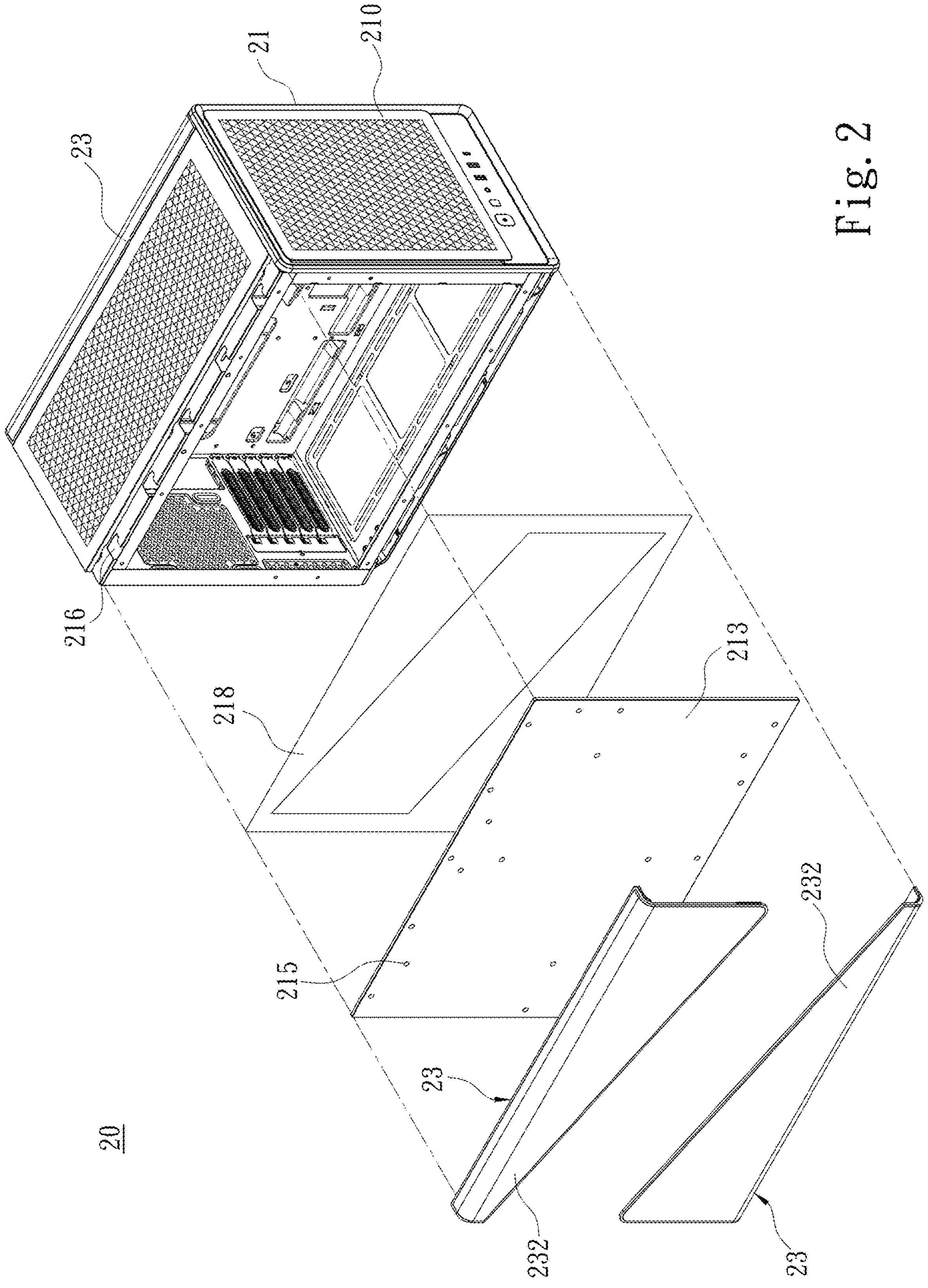
FIG. 2 shows an exploded view (II) of a first example of the present invention implemented in transparent glass.

Referring to FIG. 1, the present invention provides a case 20 combined with a decorative component made of a different material. The case 20 is a shell for an electronic product. The case 20 is not limited to a computer mainframe shell as depicted in the figures herein. The case 20 may also be a power supply shell, a quasi-system shell, etc.

With reference to FIGS. 1-6, the case 20 includes a case body 21 and at least one decorative component 23. The at least one decorative component 23 is disposed on the case body 21. The at least one decorative component 23 includes a carrier 231 and a decorative element 232, the carrier 231 not being a part of the case body 21. The case body 21 includes a plurality of side panels 210, and the plurality of side panels 210 constitute a base structure of the case 20 with a hollow interior for carrying at least one operation processor (not shown) to constitute an electronic product. The carrier 231 is an independent member relative to the case body 21 and assembled on the case body 21. The carrier 231 comprises a decorative surface 233 opposite to the case body 21. The decorative surface 233 is provided with the decorative element 232 disposed thereon, so that the decorative element 232 is exposed on the surface of the case 20. In the present invention, the material of the decorative element 232 is different from the case body 21, and patterns and textures of the decorative element 232 are not limited. Specifically, the current common material for the case body 21 is metal, plastic, etc. The material of the decorative element 232 is selected on the premise of being different from that of the case body 21 and the appearance thereof is adjusted based on the visual perception to be presented by the case 20. For example, the decorative element 232 may be a wood grain material, such that the case 20 resembles a wooden acoustic box to present the visual perception of a wooden case. In another example, the decorative element 232 may be a leather that provides a luxury and fashionable visual appearance that allows the case 20 to exhibit the visual aesthetics provided by the combination of the leather material and the case body 21.

From the foregoing, the case 20 provides a visual perception distinct from the conventional technique through the selection of the decorative element 232, and the carrier 231 is advantageous for the replacement of the decorative element 232, so that the case 20 may exhibit various visual effects in combination with different decorative elements 232. In addition, the carrier 231 is provided to assemble the at least one decorative component 23 on the case body 21 without being restricted by the structure of the case body 21. Meanwhile, the assembled at least one decorative component 23 does not affect the structural strength of the case body 21. In view of the above, it can be seen that the present invention effectively ameliorates the problem that conventional cases do not facilitate the bonding of decorative components of different materials.

Referring back to FIGS. 1-6, in order to create a different visual perception for the case 20, the case body 21 is divided into a transparent region 211 and a non-transparent region 212 by the at least one decorative component 23 at a side of the case body provided with the at least one decorative component 23. The transparent region 211 allows a user to directly observe the interior of the case body 21 from the outside, and the non-transparent region 212 prevents the user from viewing the interior of the case body 21 from the outside. In an example, referring to FIG. 1 and FIG. 2, the case body 21 may be provided with a transparent glass 213 at a side of the case body 21 provided with the at least one decorative component 23. The transparent region 211 is formed by a portion of the transparent glass 213 not covered by the at least one decorative component 23. The non-transparent region 212 is formed by the portion of the transparent glass 213 covered by the at least one decorative component 23. Further, the transparent glass 213 may also be provided with at least one shield 218 located on at least a side of the transparent glass 213 and defining, together with the at least one decorative component 23, the transparent region 211 of the transparent glass 213.

In another example, referring to FIGS. 3-6, the case body 21 is formed with a plurality of through holes 214 at a side of the case body 21 provided with the at least one decorative component 23. The non-transparent region 212 is formed by the portions of the through holes 214 covered by the at least one decorative component 23. The transparent region 211 is formed by the portions of the through holes 214 not covered by the at least one decorative component 23. In the present example, in addition to the function of providing a see-through view, the transparent region 211 also serves for the heat dissipation, allowing the heat dissipation gas from the inside of the case body 21 to be discharged towards the outside via the through holes 214.

Figure 3:
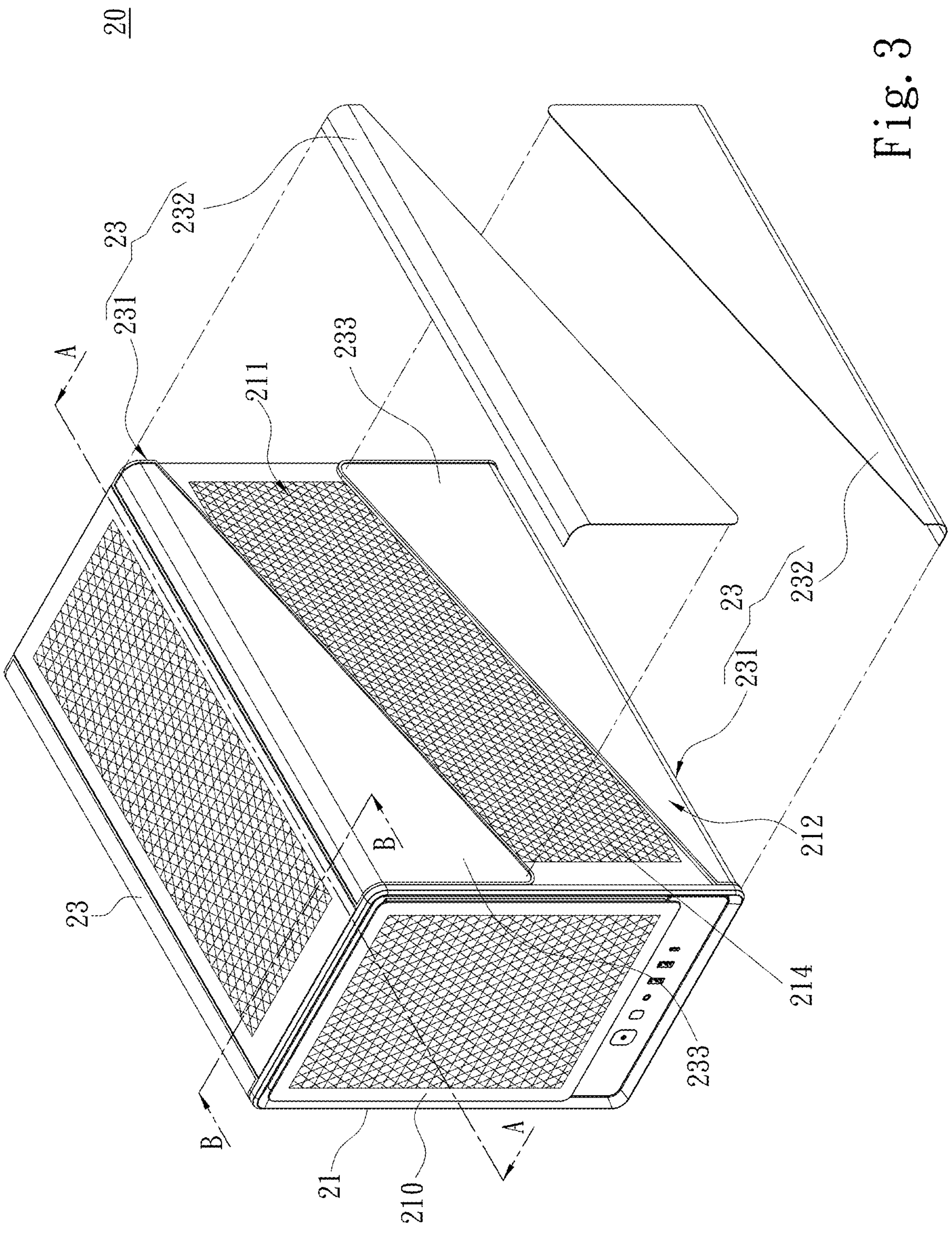
FIG. 3 shows an exploded view (I) of a first example of the present invention implemented in a through hole.
Figure 4:
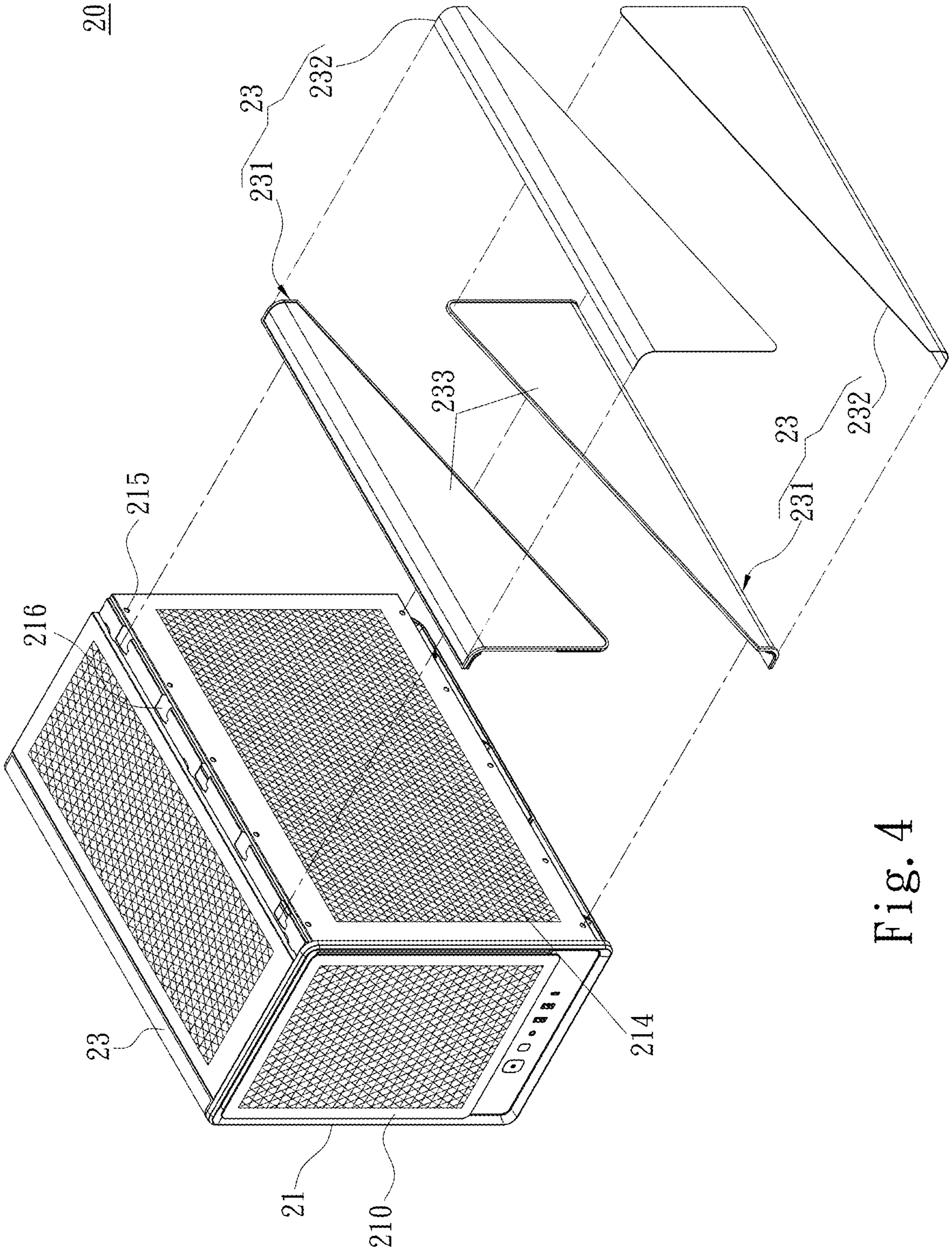
FIG. 4 shows an exploded view (II) of a first example of the present invention implemented in a through hole.
Figure 5:
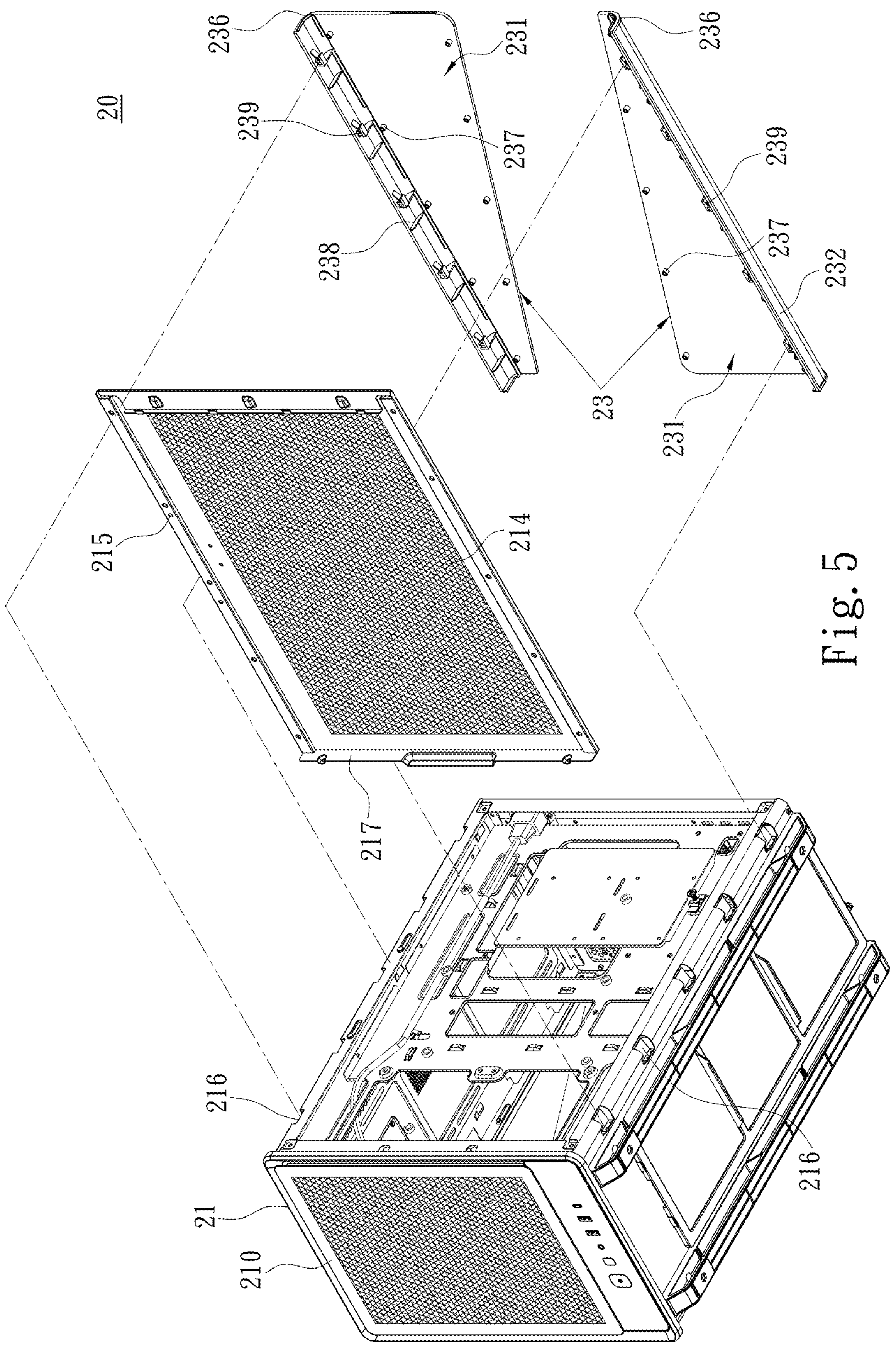
FIG. 5 shows an exploded view (III) of a first example of the present invention implemented in a through hole.
Figure 6:
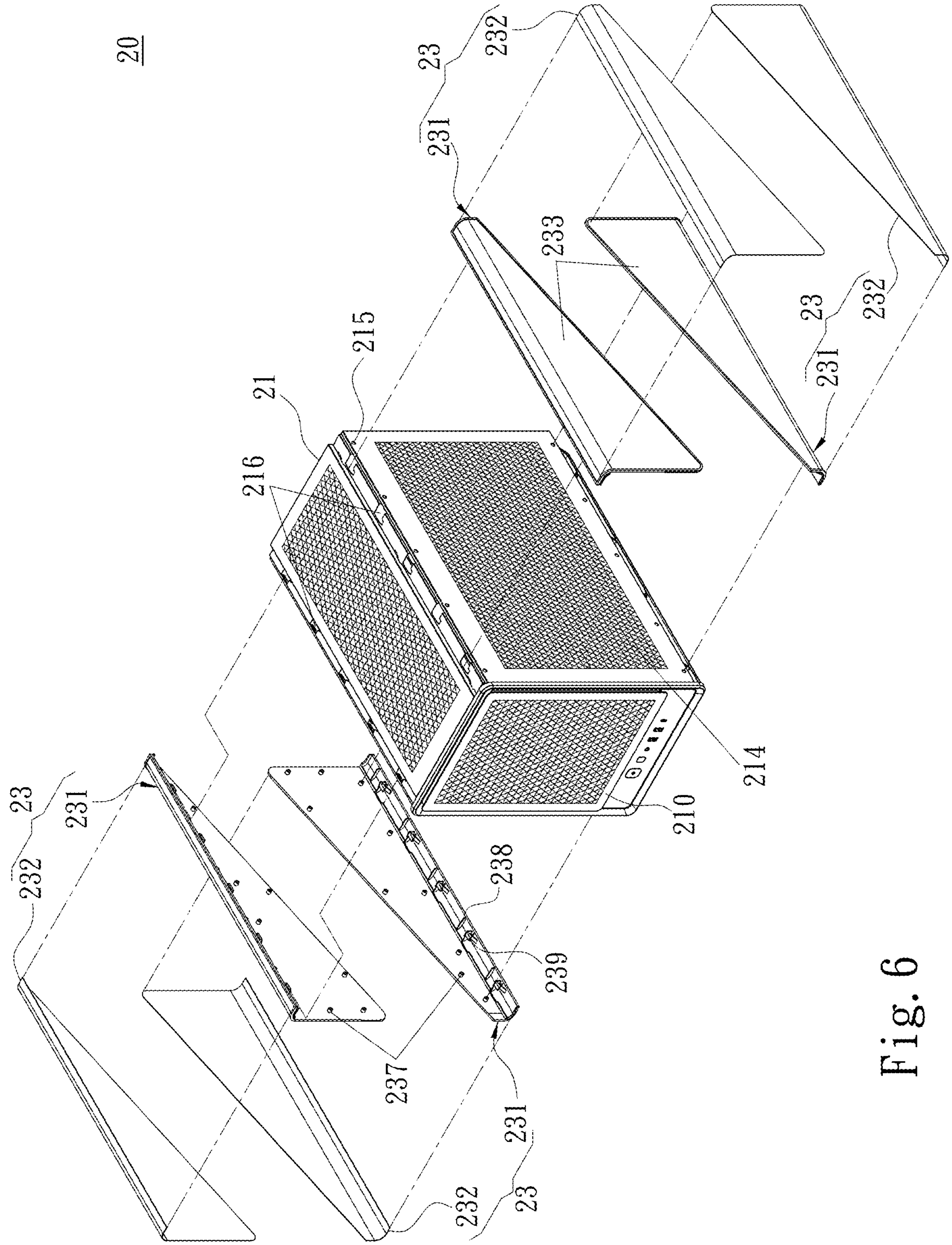
FIG. 6 shows an exploded view (IV) of a first example of the present invention implemented in a through hole.
Figure 7:
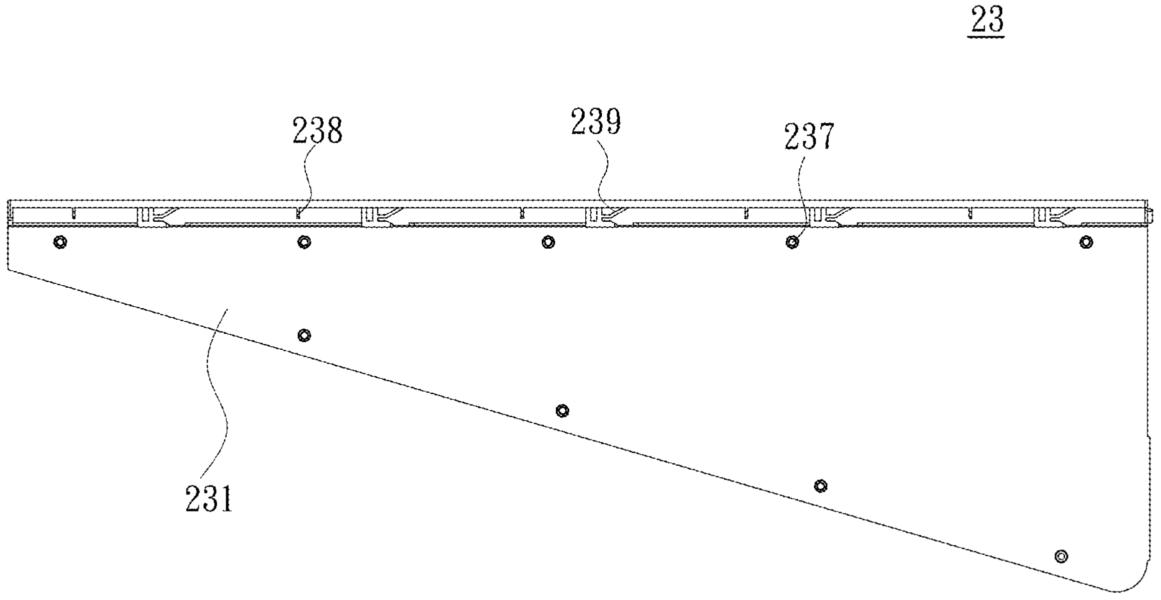
FIG. 7 shows a planar structure view of a decorative component according to a first example of the present invention.
Figure 8:
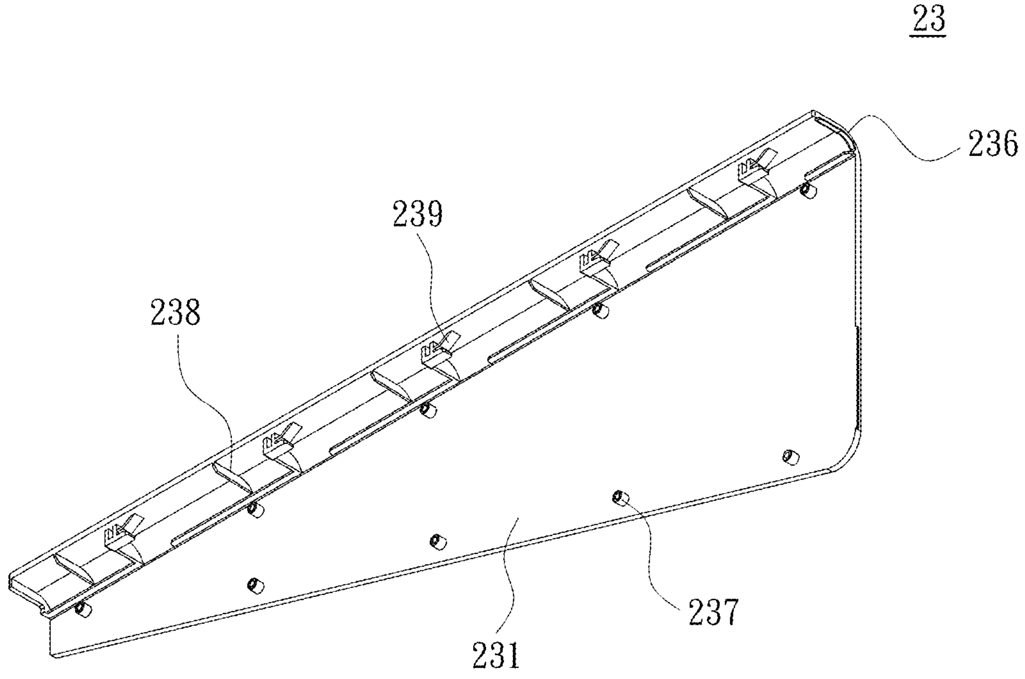
FIG. 8 shows a structural perspective view of the decorative component according to the first example of the present invention.
Figure 9:
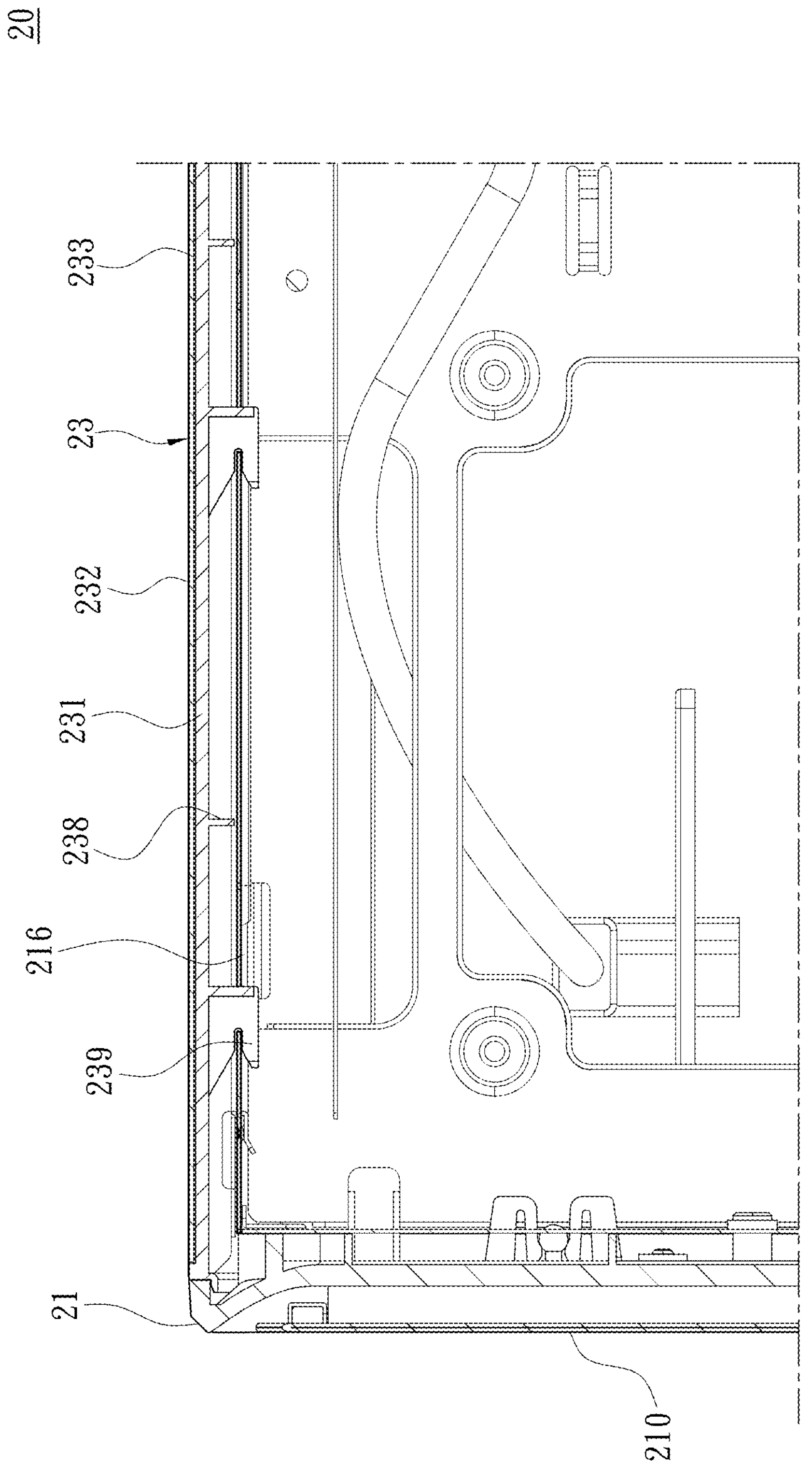
FIG. 9 shows a cutaway view along a line A-A of FIG. 3.
Figure 10:
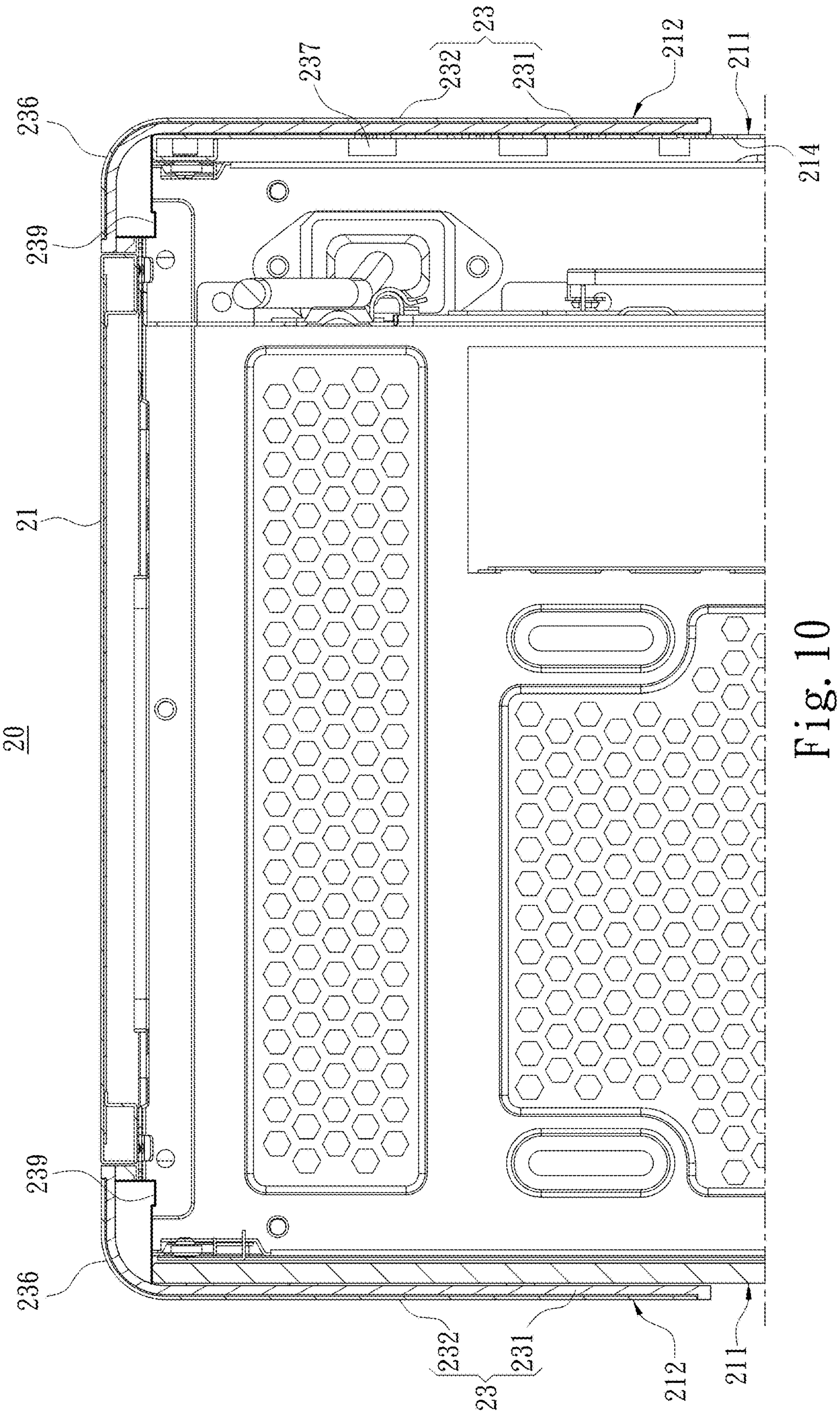
FIG. 10 shows a cutaway view along a line B-B of FIG. 3.
Figure 11:
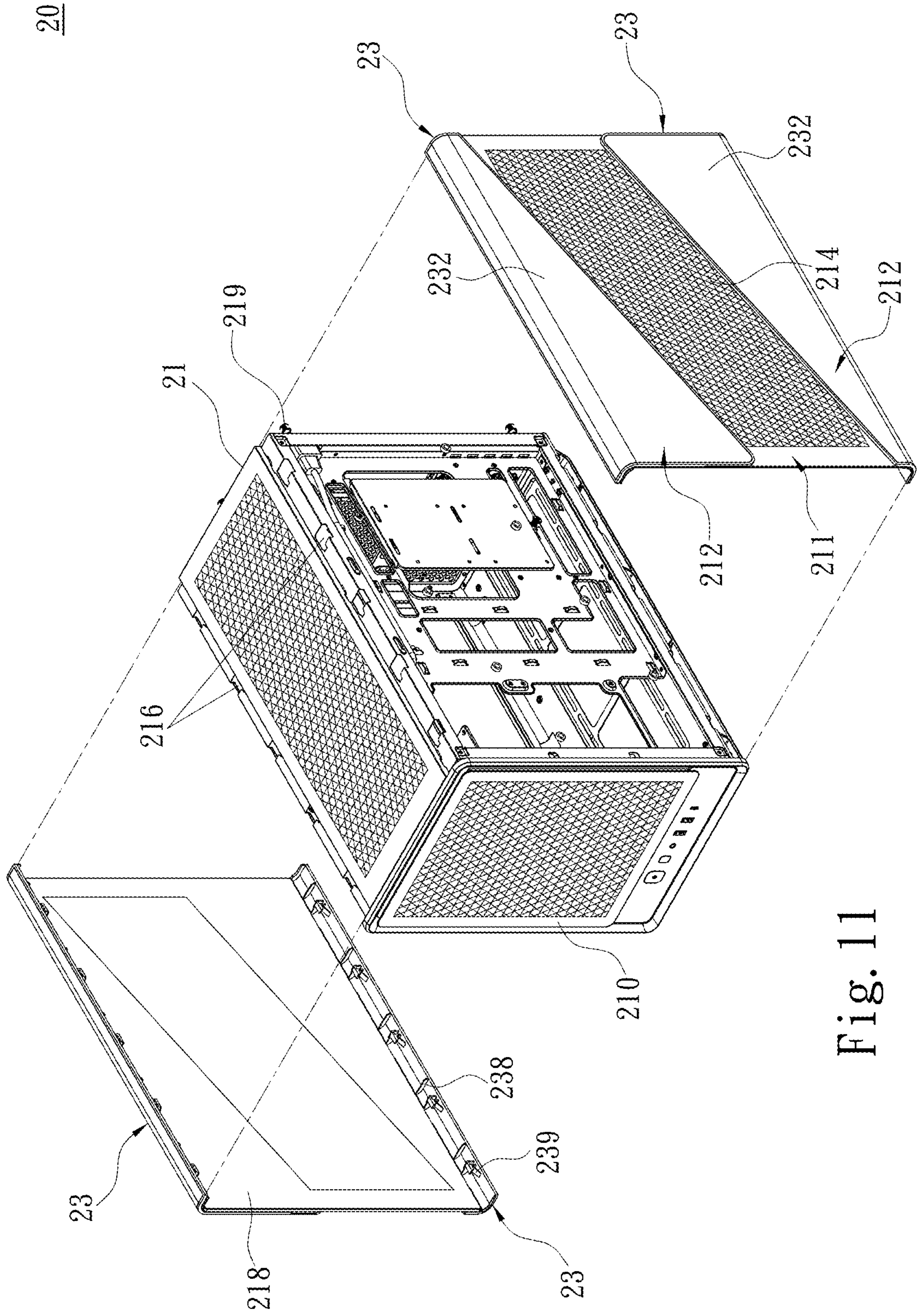
FIG. 11 shows a schematic implementation of the first example of the invention.
Figure 12:
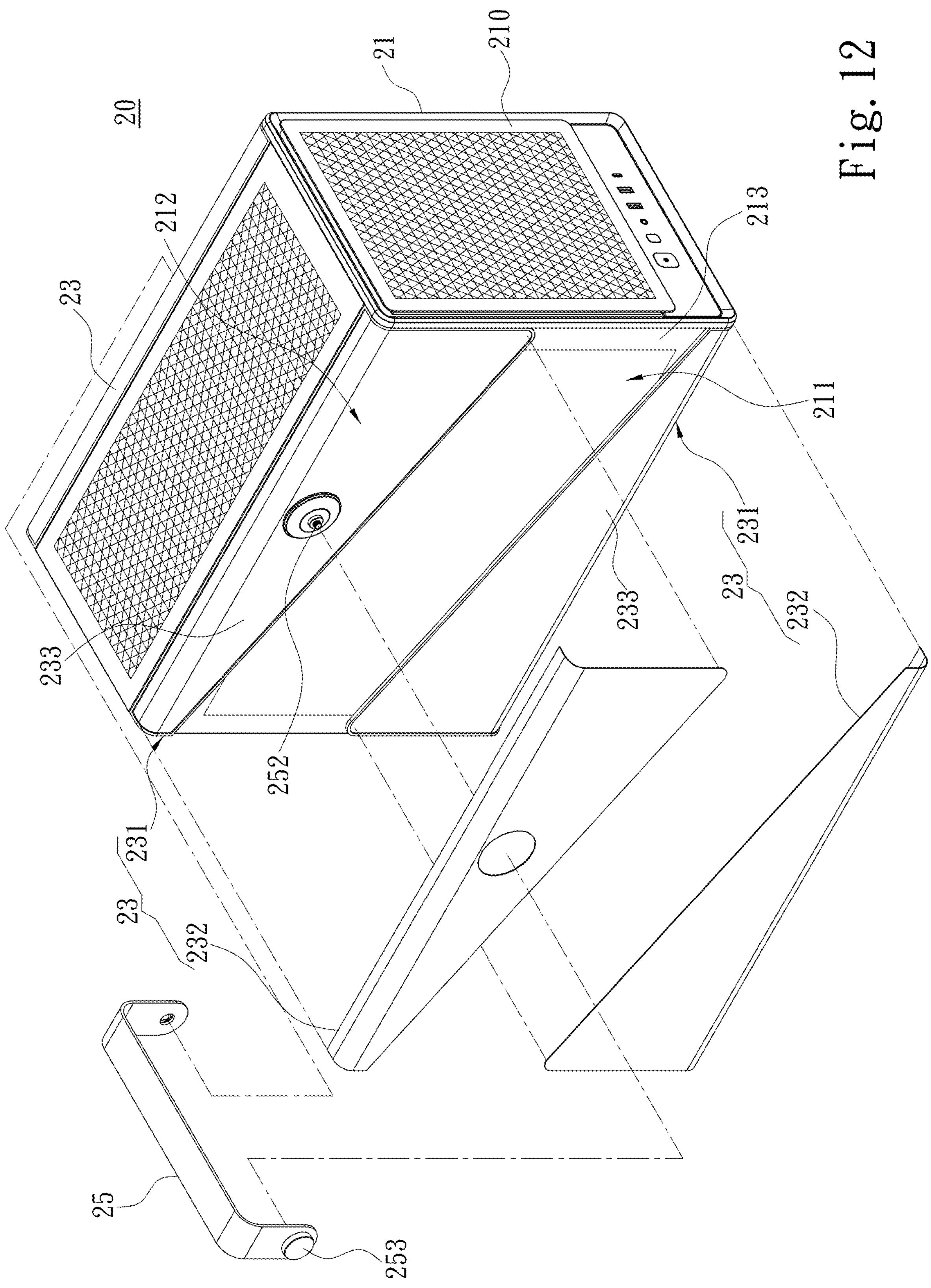
FIG. 12 shows an exploded view (I) of a second example of the present invention implemented in transparent glass.
Figure 13:
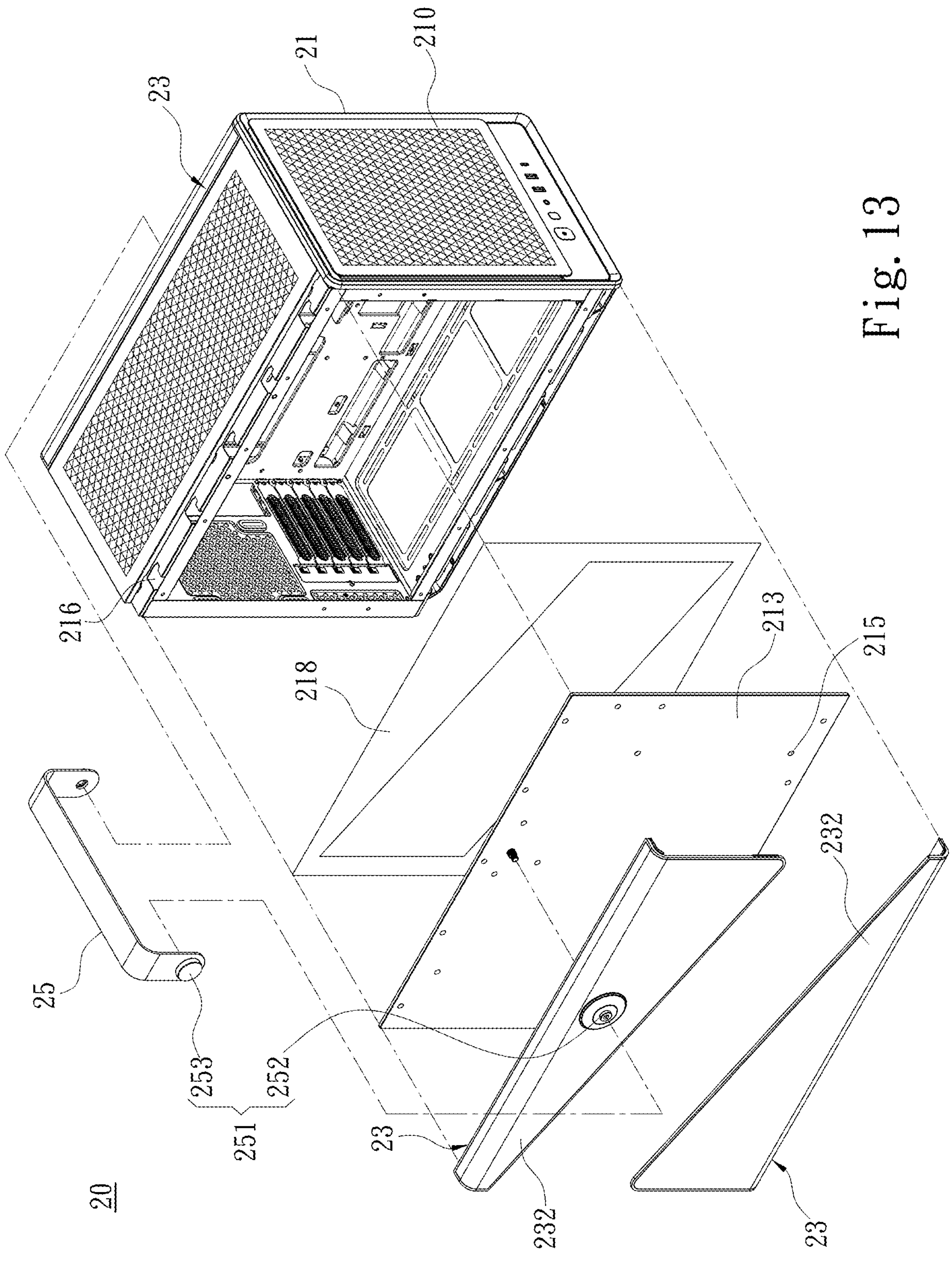
FIG. 13 shows an exploded view (II) of a second example of the present invention implemented in transparent glass.
Figure 14:
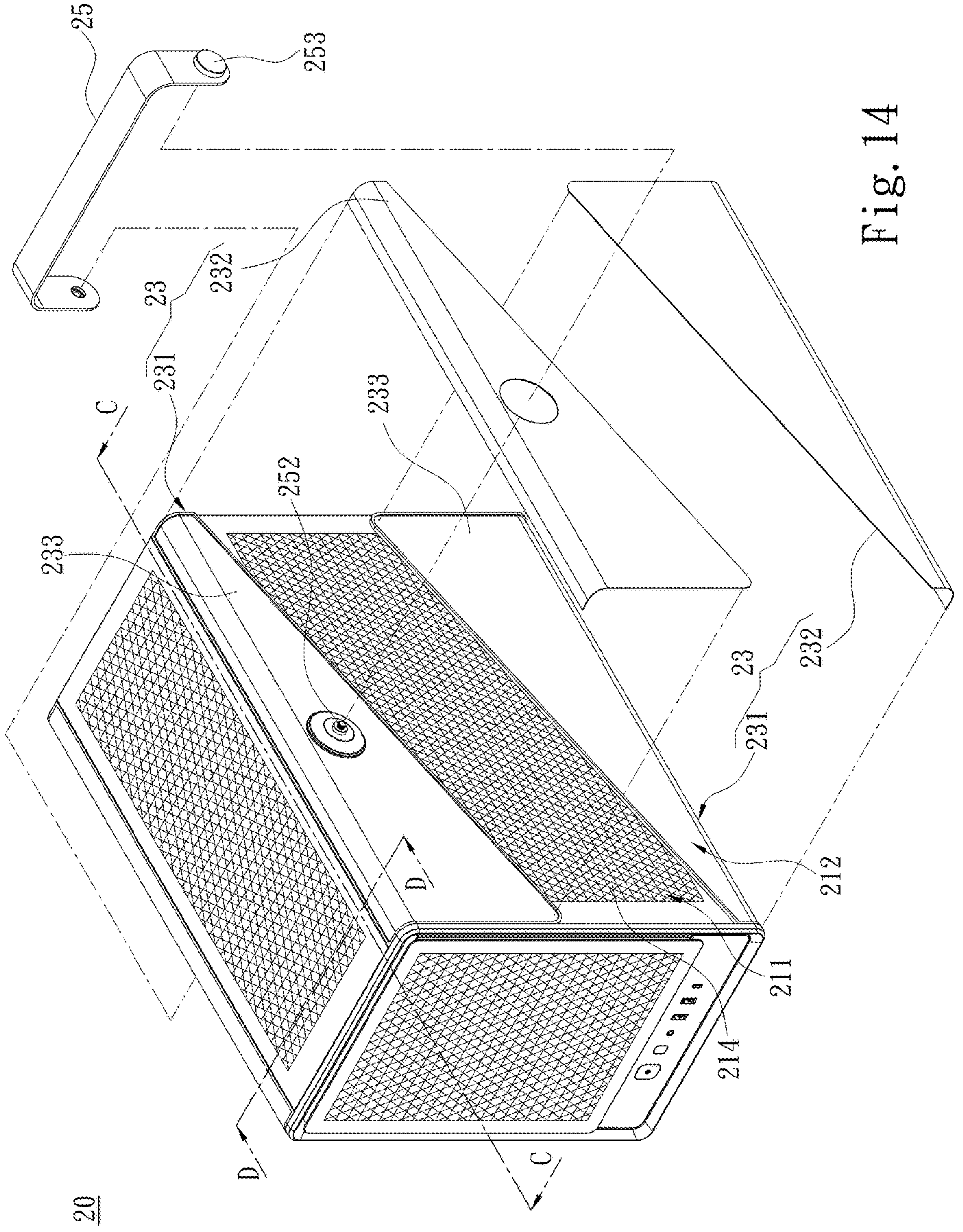
FIG. 14 shows an exploded view (I) of a second example of the present invention implemented in a through hole.
Figure 15:
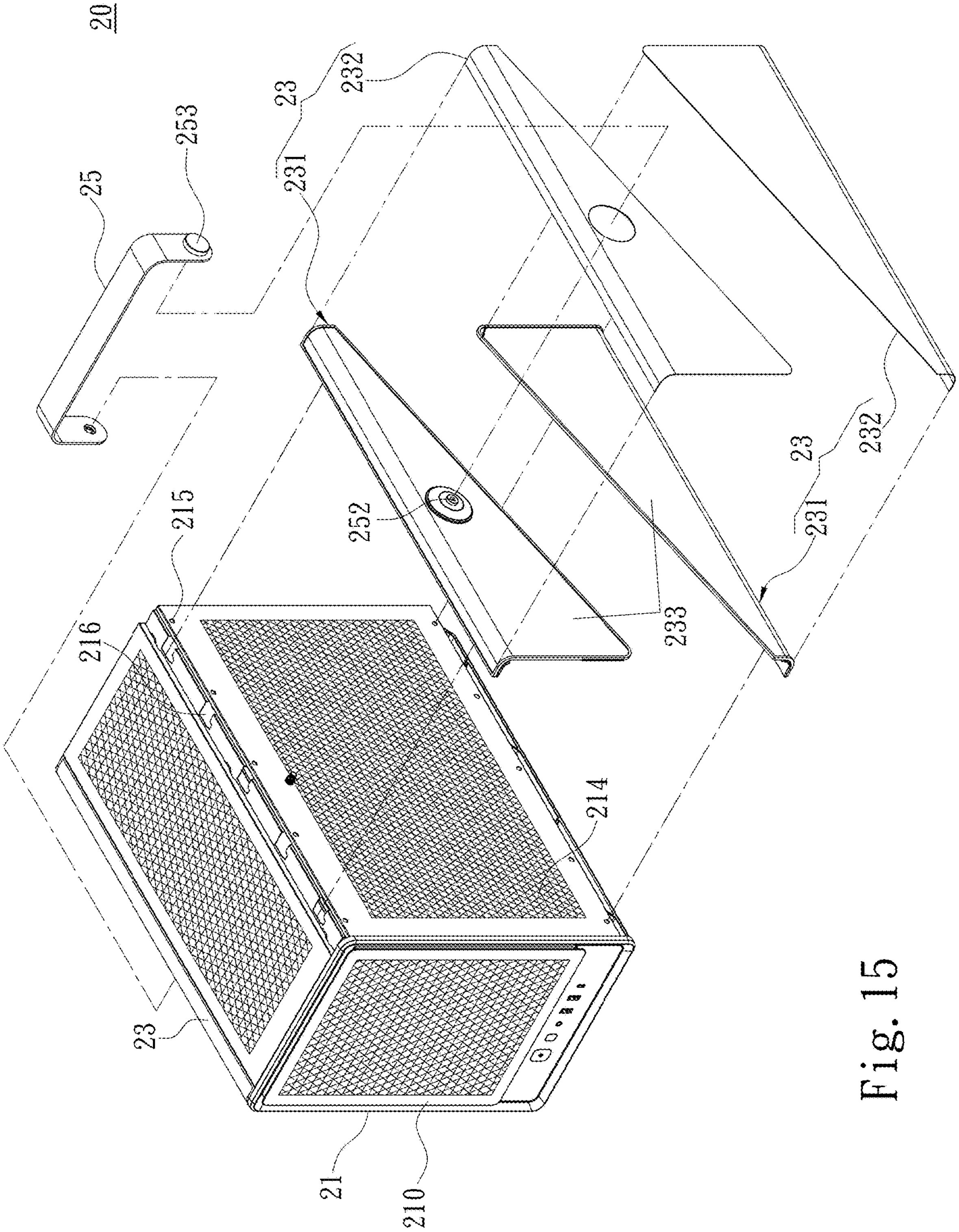
FIG. 15 shows an exploded view (II) of a second example of the present invention implemented in a through hole.
Figure 16:
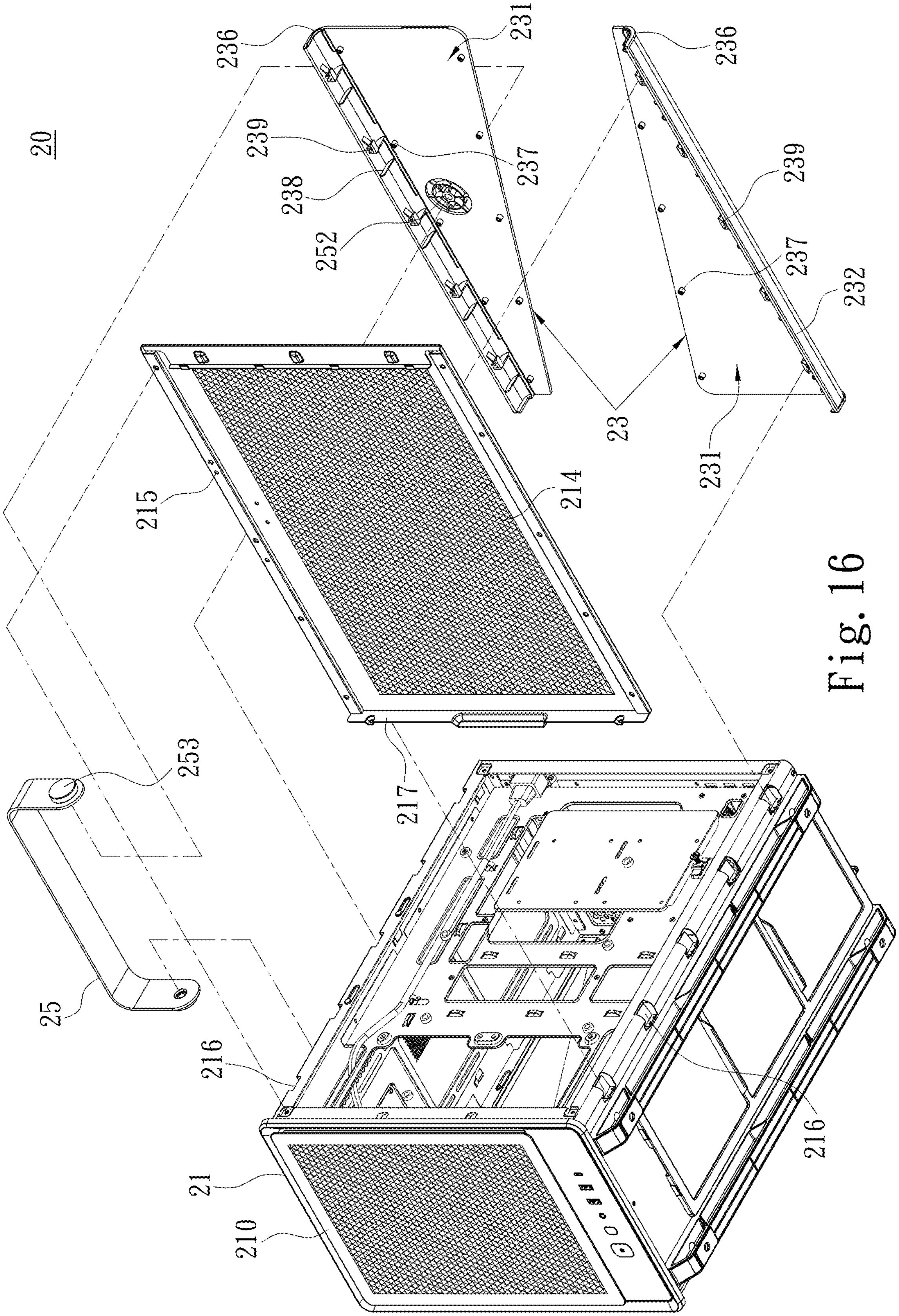
FIG. 16 shows an exploded view (III) of a second example of the present invention implemented in a through hole.
Figure 17:
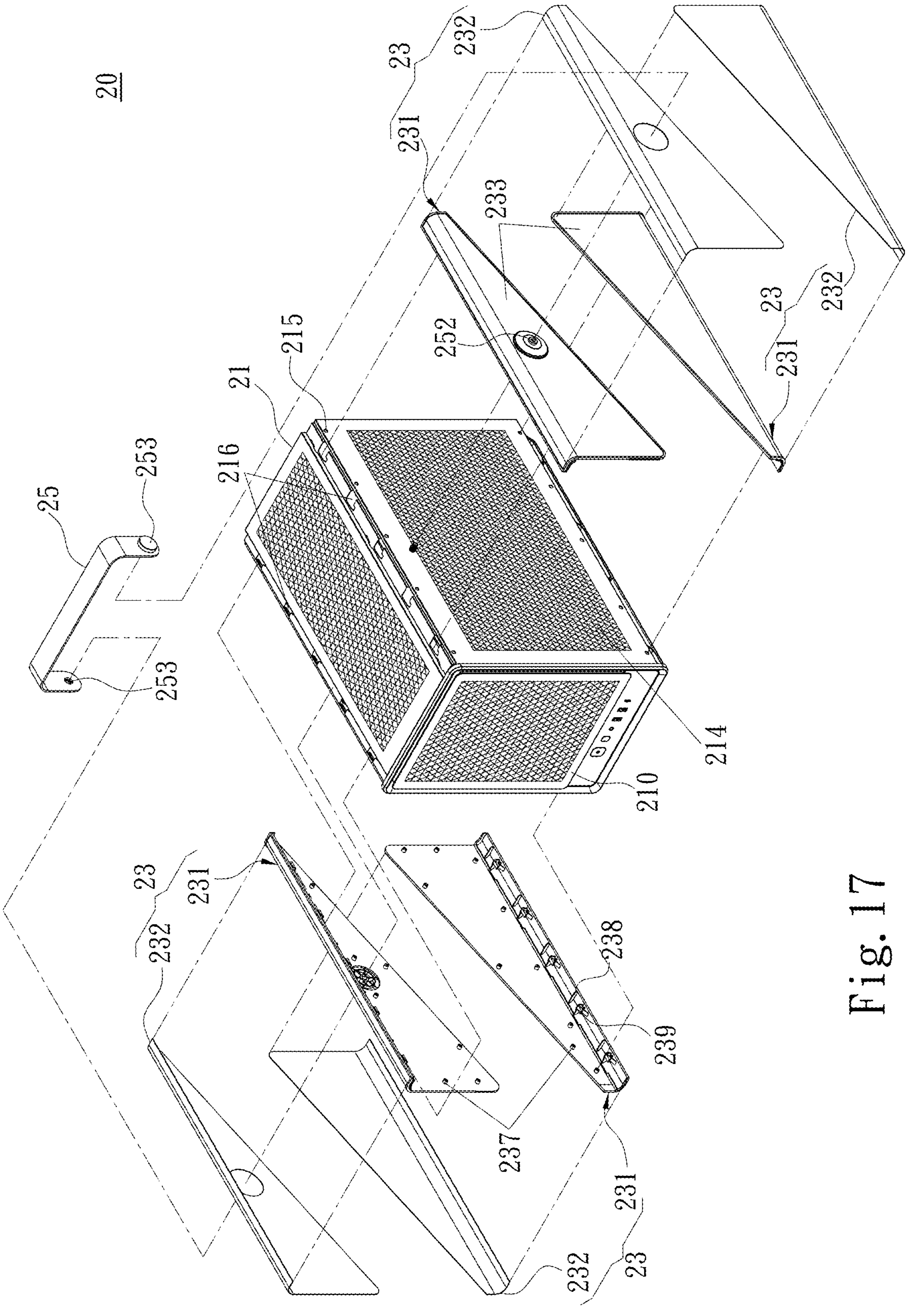
FIG. 17 shows an exploded view (IV) of a second example of the in present invention implemented in a through hole.
Figure 18:
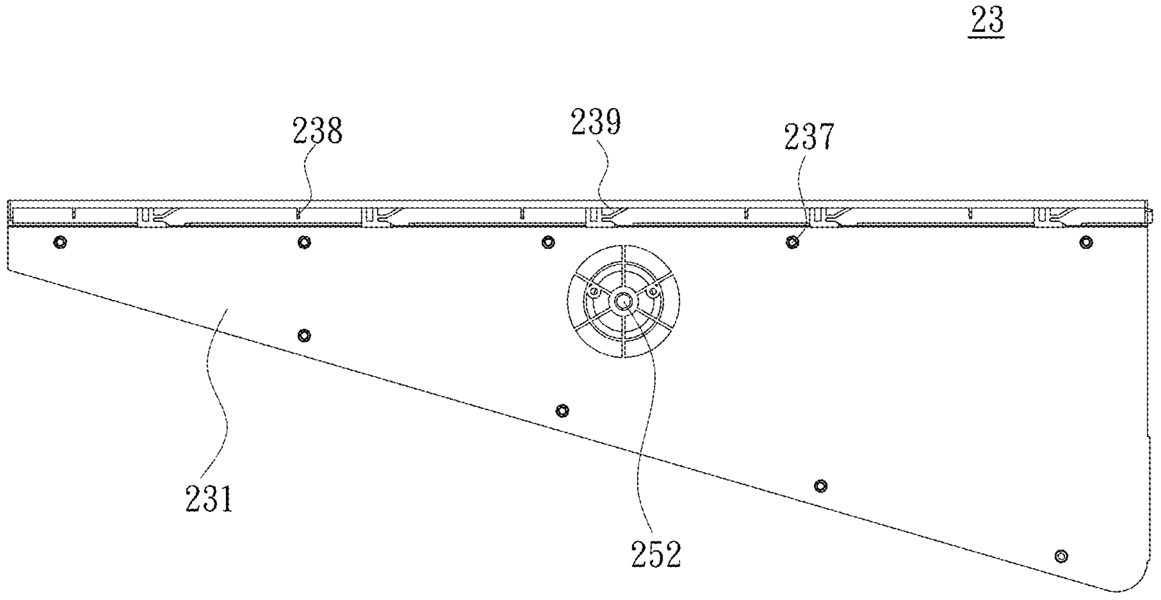
FIG. 18 shows a planar structure view of a decorative component according to a second example of the present invention.
Figure 19:
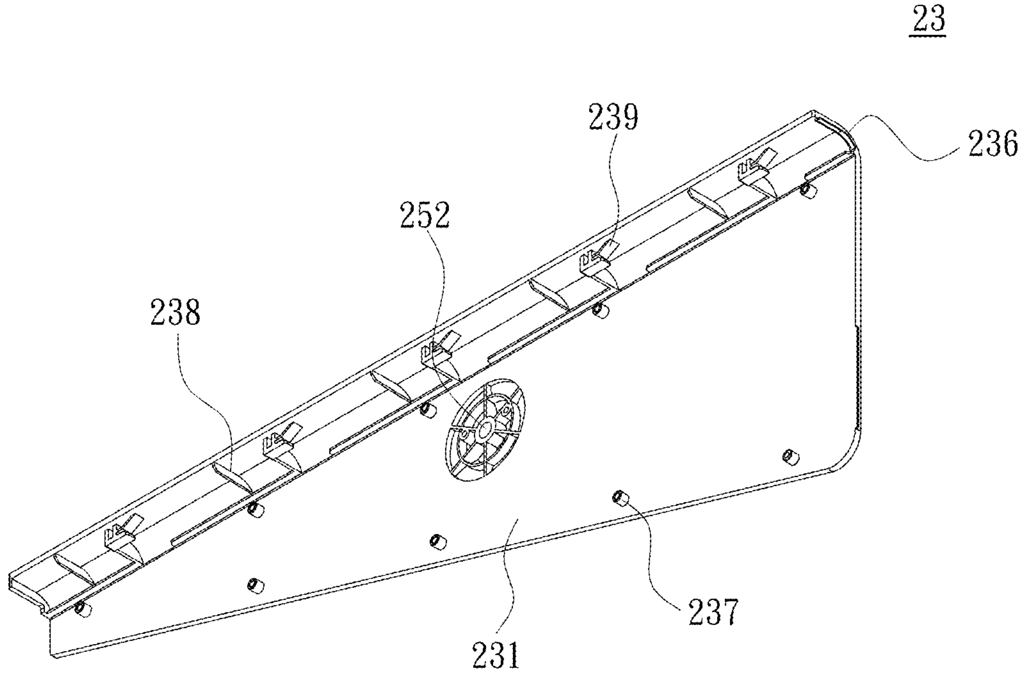
FIG. 19 shows a structural perspective view of the decorative component according to a second example of the present invention.
Figure 20:
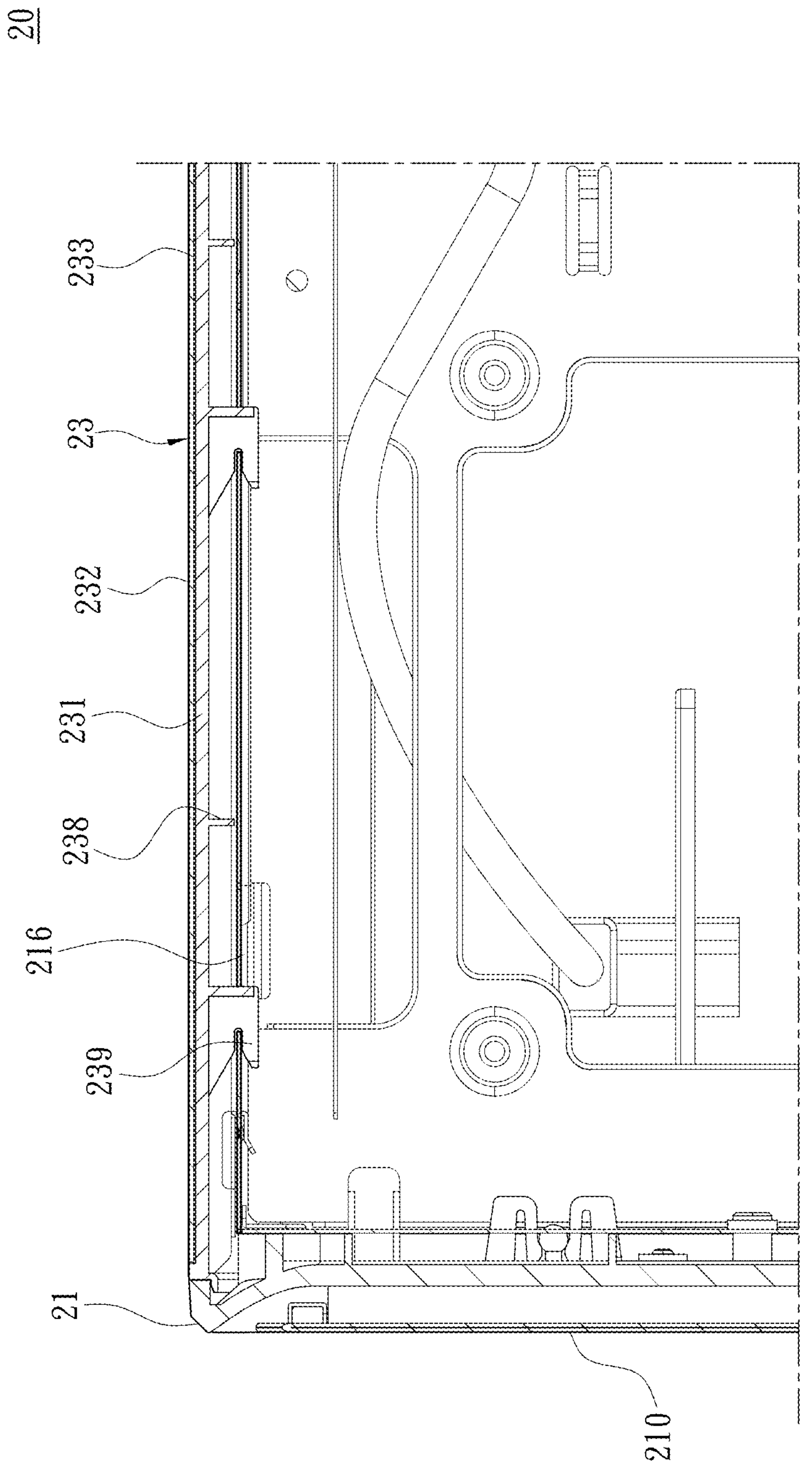
FIG. 20 shows a cutaway view along a line C-C of FIG. 14.
Figure 21:
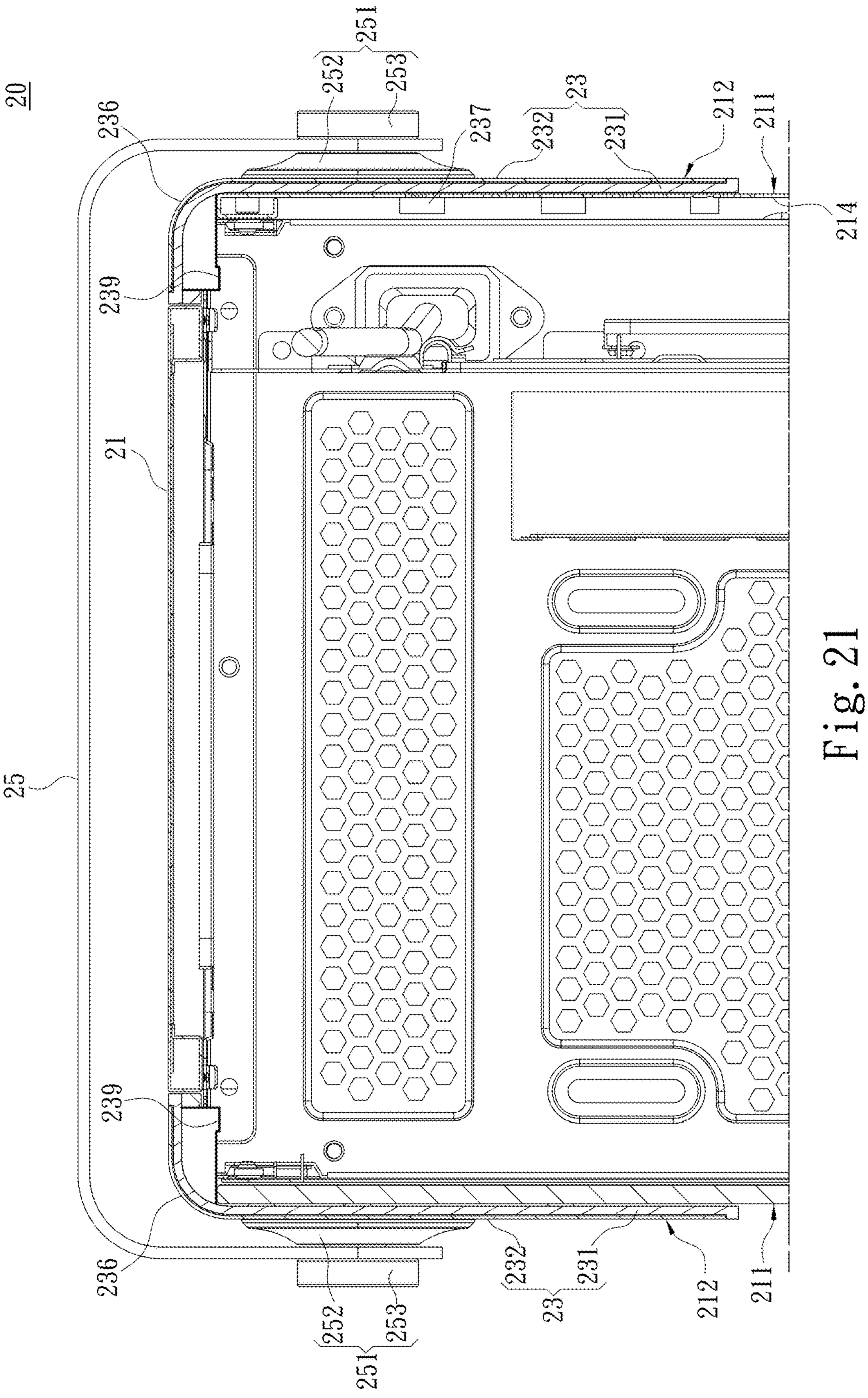
FIG. 21 shows a cutaway view along a line D-D of FIG. 14.
Figure 22:
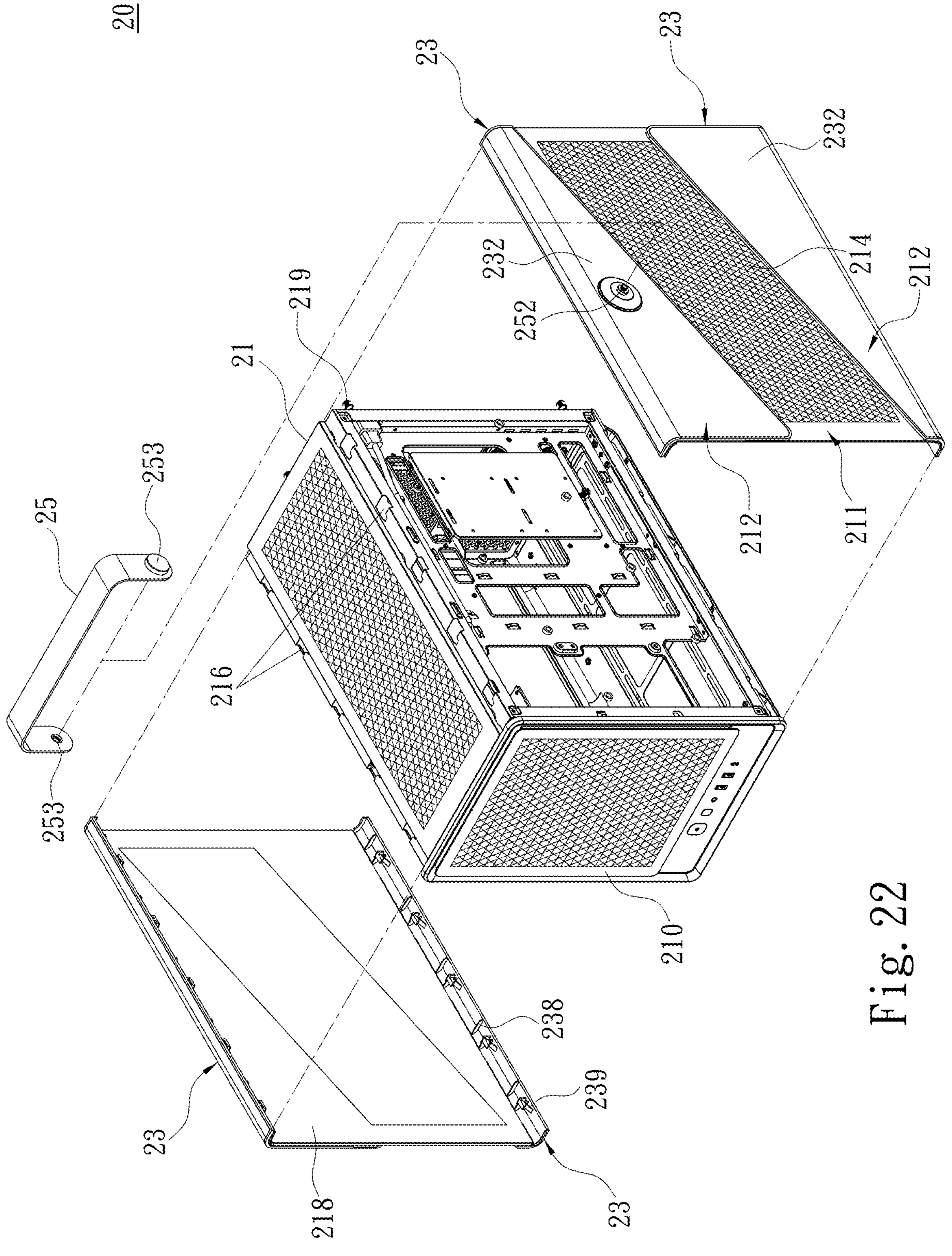
FIG. 22 shows an implementation view according to a second example of the invention.

Referring back to FIGS. 1-6, the at least one decorative component 23 of the present invention conforms to the shape of the case body 21. The at least one decorative component 23 may be a flat plate or may have at least one bend 236. In addition, the at least one decorative component 23 may be plural. The plurality of decorative components 23 are disposed on the same side or different sides of the case body 21. When the plurality of the decorative components 23 are disposed on the same side of the case body 21, the plurality of the decorative components 23 do not completely cover the same side of the case body 21, so that the transparent region 211 of the case body 21 is configured in a quadrangular shape, as shown in FIG. 1 and FIG. 3.

Referring again to FIGS. 12-22, when the plurality of decorative components 23 are located on two opposite sides of the case body 21, the case 20 may be further implemented with a handle 25. Two ends to the handle 25 are located on the opposite sides of the case body 21 by taking the plurality of decorative components 23 as a connection basis. Thus, the handle 25 provides a function of handling so that the case 20 can be conveniently handled. The handle 25 may be made of the same material as that of the decorative element 232 to create a consistent and harmonious experience. The handle 25 may also be made of a different material than that of the decorative element 232 to provide a visual impact effect. Further, the handle 25 is provided with a plurality of pivots 251 connected to the plurality of decorative components 23, and the plurality of pivots 251 are connected to both ends of the handle 25, respectively, so that the handle 25 may pivot with respect to the plurality of the decorative components 23. In an example, each of the pivots 251 is a buckle. The handle 25 and the at least one decorative component 23 are provided with at least one male fastener 252 and at least one female fastener 253, respectively.

With reference to FIGS. 5-8 and FIGS. 16-19, in order to provide a stable assembly of the at least one decorative component 23 on the case body 21, in an example, the at least one decorative component 23 comprises a first positioning structure 237, and the case body 21 comprises a second positioning structure 215. The first positioning structure 237 is disposed on the carrier 231 and faces towards the case body 21. The second positioning structure 215 is located at a position where the case body 21 is to be assembled with the carrier 231, and cooperates with the first positioning structure 237. The term "cooperation" refers to the correspondence between the first positioning structure 237 and the second positioning structure 215, and the at least one decorative component 23 is disposed on the case body 21 after assembly. For example, the first positioning structure 237 and the second positioning structure 215 may be combined by magnetic attraction or may be implemented by mechanical connection. In the example, the first positioning structure 237 is at least one embossment, and the second positioning structure 215 is at least one engaging part. In another example, the at least one decorative component 23 is provided with at least one rib 238 which is located on a side of the carrier 231 facing towards the case body 21 and abuts against the case body 21.

Referring to FIGS. 9-10 and FIGS. 20-21, in order to prevent the at least one decorative component 23 from being removed from the case body 21, in an example, the case body 21 is provided with at least one engaging part 216. The at least one decorative component 23 comprises at least one guiding grab 239. The at least one guiding grab 239 is disposed on the carrier 231 and penetrates into the at least one engaging part 216. The at least one guiding grab 239 restricts the assembly direction of the at least one decorative component 23 and prevents the at least one decorative component 23 from being removed from the case body 21 after penetrating into the at least one engaging part 216.

Referring to FIG. 5, FIG. 11, FIG. 16, and FIG. 22, the at least one decorative component 23 and a side of the case body 21 with which the at least one decorative component 23 is to be assembled are assembled as a modular structure. The term "modular structure" refers to the at least one decorative component 23 assembled with one side of the case body 21 is considered to be a single component which may be assembled on the case body 21 as a unified part. In the present example, at least one mounting sub-panel 217 is provided at a side of the case body 21 on which the at least one decorative component 23 is to be assembled. The at least one mounting sub-panel 217 is bent with respect to a side of the case body 21 on which the at least one decorative component 23 is to be assembled, so as to restrict the assembly of the side of the case body 21 on which the at least one decorative component 23 is to be assembled with the remaining side of the case body 21. Further, the mounting of the at least one mounting sub-panel 217 to the remaining side of the case body 21 may be achieved with a mechanical connection, such as at least one screw fitting 219, and a magnetic structure, such as at least one magnet.

What is claimed is:

1. A case combined with a decorative component made of a different material, comprising a case body; and a plurality of the decorative components comprising a carrier assembled to the case body and a decorative element disposed on the carrier, wherein the carrier comprises a decorative surface opposite to the case body, and the decorative element is provided on the decorative surface, the decorative element being made of a material different from that of the case body; and the case body is provided with a transparent glass at a side of the case body provided with the decorative components; and the plurality of decorative components are located on opposite sides of the case body, and the case is provided with a handle with two ends located on the opposite sides of the case body by taking the plurality of decorative components as a connection basis; and the handle is provided with a plurality of pivots connecting the plurality of decorative components, the handle is allowed to pivot relative to the plurality of decorative components.

2. The case combined with the decorative component made of the different material according to claim 1, wherein the case body is divided into a transparent region and a non-transparent region by the decorative component at a side of the case body provided with the decorative component.

3. The case combined with the decorative component made of the different material according to claim 1, wherein the case body is formed with a plurality of through holes at the side of the case body provided with the decorative component.

4. The case combined with the decorative component made of the different material according to claim 1, wherein the decorative component is provided with a first positioning structure disposed on the carrier, and the case body is provided with a second positioning structure cooperating with the first positioning structure.

5. The case combined with the decorative component made of the different material according to claim 4, wherein the case body is provided with at least one engaging part, and the decorative component is provided with at least one guiding grab disposed on the carrier and penetrating into the at least one engaging part.

6. The case combined with the decorative component made of the different material according to claim 5, wherein the case body comprises a plurality of side panels, and one of the plurality of side panels assembled with the decorative component comprises at least one mounting sub-panel, and the at least one mounting sub-panel is assembled with at least one of the other side panels which is adjacent to the side panel assembled with the decorative component.

* * * * *